(12) United States Patent
Haag et al.

(10) Patent No.: US 9,227,259 B2
(45) Date of Patent: Jan. 5, 2016

(54) INCREASING THE EFFICIENCY OF SOLAR CELLS BY TRANSFER OF SOLDER

(75) Inventors: Michael Haag, Rodenbach (DE);
Ruediger Kellmann, Mainz (DE);
Markus Schmidt, Seibersbach (DE)

(73) Assignee: International Business Machines Corporation, Armonk, NY (US)

( * ) Notice: Subject to any disclaimer, the term of this patent is extended or adjusted under 35 U.S.C. 154(b) by 155 days.

(21) Appl. No.: 13/591,305

(22) Filed: Aug. 22, 2012

(65) Prior Publication Data

US 2014/0053899 A1 Feb. 27, 2014

(51) Int. Cl.
*H01L 31/0224* (2006.01)
*H01L 31/18* (2006.01)
*B23K 1/20* (2006.01)
*B23K 1/00* (2006.01)
*B23K 3/06* (2006.01)

(52) U.S. Cl.
CPC ............... *B23K 1/20* (2013.01); *B23K 1/0016* (2013.01); *B23K 3/0638* (2013.01); *H01L 31/022425* (2013.01); *B23K 2201/42* (2013.01); *Y02E 10/50* (2013.01)

(58) Field of Classification Search
CPC ............... B23K 1/203; B23K 2201/40; B23K 2201/42; B23K 3/023; H01L 31/0224
USPC ........................................................ 438/612
See application file for complete search history.

(56) References Cited

U.S. PATENT DOCUMENTS

| | | | | |
|---|---|---|---|---|
| 5,130,779 | A * | 7/1992 | Agarwala et al. | 257/772 |
| 6,139,972 | A * | 10/2000 | Trott et al. | 428/458 |
| 2004/0149332 | A1 * | 8/2004 | Tanaka et al. | 136/256 |
| 2007/0246516 | A1 * | 10/2007 | Cordes et al. | 228/180.22 |
| 2009/0025789 | A1 | 1/2009 | Chan et al. | |
| 2009/0266401 | A1 | 10/2009 | Stangl et al. | |
| 2009/0283575 | A1 * | 11/2009 | Budd et al. | 228/246 |
| 2010/0051085 | A1 | 3/2010 | Weidman et al. | |
| 2010/0089447 | A1 | 4/2010 | Basol et al. | |
| 2010/0229917 | A1 | 9/2010 | Choi et al. | |
| 2011/0079278 | A1 * | 4/2011 | Dunkley | 136/256 |
| 2011/0312121 | A1 * | 12/2011 | Yamazaki | 438/71 |

OTHER PUBLICATIONS

Stark et al, A mold and transfer technique for lead-free fluxless solder and application to wafer-level low-temperature thin-film packages, 2004, Center for Wireless Integrated Microsystems, pp. 13-16.*
Fioramonti, Cell Efficiency Increase of 0.4% Through Light-Induced Plating, Photovoltaics International, 2009.
Wefringhaus et al., Electroless Silver Plating of Screen Printed Front Grid Fingers as a Tool for Enhancement of Solar Cell Efficiency, Sep. 2007.
Rohatgi et al., High Efficiency Screen-Printed Solar Cells on Textured Mon0-Crystalline Silicon, Sep. 2006.

* cited by examiner

*Primary Examiner* — Jonathan Johnson
*Assistant Examiner* — Bethany L Martin
(74) *Attorney, Agent, or Firm* — Lieberman & Brandsdorfer, LLC

(57) ABSTRACT

Thickening a contact grid of a solar cell for increased efficiency. A mold containing soldering material is heated. The mold is aligned with the contact grid such that the soldering material is in physical contact with the contact grid. The mold is re-heated, transferring the solder material from the mold to the contact grid to create a thickened contact grid.

11 Claims, 3 Drawing Sheets

INCREASING THE EFFICIENCY OF SOLAR CELLS BY TRANSFER OF SOLDER

BACKGROUND

1. Technical Field

The present invention relates to a solar cell. More specifically, the invention relates to a method and system for increasing the efficiency of a solar cell by increasing the thickness of a contact grid to reduce resistance in the cell.

2. Description of the Prior Art

Solar cells convert radiation energy into electrical energy. Much research has been conducted to maximize the efficiency of the solar cell. One limitation in maximizing efficiency is the lost energy due to internal series resistance of the cell. To collect the current of electrons that flows over the surface of the solar cell, a contact grid must be embedded in the conductive material of the cell. Because the internal resistance of a typical solar cell is relatively high, the contact grid of the solar cell is placed across the surface of a cell to minimize the distance an electron has to travel on the surface of a cell, thus minimizing ohmic losses due to internal resistance.

One aspect to increase solar cell efficiency uses light induced electroplating to thicken the contact grid of a solar cell to reduce series resistance. Electroplating in general is a relatively complicated process that requires processing time and for some applications the use of hazardous materials, such as lead and various electrochemicals. Accordingly, an alternative method and product that increases efficiency of a solar cell is desired.

SUMMARY

This invention comprises a method and system for reducing resistance in a solar cell.

In one aspect, a method is provided for thickening a contact grid of a solar cell. A first body comprised of a first mold and at least one hollowed out area containing solder material is heated. More specifically, the first body is heated such that the solder forms into at least one spherical ball within the hollowed out area. The first body is aligned with a second body having an active layer in communication with an inactive layer, with the inactive layer having a contact grid with a first thickness. More specifically, the bodies are aligned such that the solder material is placed in physical contact with the contact grid. Upon alignment, the first body is re-heated, melting the solder material and transferring the solder material from the first body to the second body, thereby increasing the thickness of the contact grid to a second thickness. By increasing the thickness of the contact grid, the resistance in a solar cell is reduced.

In another aspect, a solar cell with a contact grid having an increased thickness is provided. The solar cell comprises of an active layer in communication with a substrate. The substrate comprises an embedded contact grid having a conducting material with a first thickness. The contact grid is provided in communication with a diode. The contact grid is further provided with at least one solder ball pre-formed in a mold and transferred from the mold to the contact grid. More specifically, the mold is aligned with the contact grid such that the solder ball is in physical contact with the contact grid. The mold is heated such that the solder ball is melted, detached from the mold, and soldered to the contact grid. The melting of the solder ball softens the solder material such that the solder adheres to the contact grid, and increases the thickness of the contact grid to a second thickness. Accordingly, a solar cell is provided with an increased thickness of the contact grid to reduce resistance.

In yet another aspect, a solar cell is produced by the method as described. A mold is provided with at least one hollowed out area containing solder material. The mold is heated such the solder material softens and forms into at least one spherical ball within the hollowed out area. The mold containing the solder ball is aligned with a body comprising a contact grid in communication with a diode and having a first thickness. More specifically, the mold is aligned such that the solder material is in physical contact with the contact grid. Once aligned, the mold with the solder ball is re-heated such that the solder material liquefies and is transferred from the mold to the contact grid of the second body, increasing the thickness of the contact grid of the second body from a first thickness to a second thickness. Accordingly, a solar cell is provided having a thickened contact grid to reduce cell resistance.

BRIEF DESCRIPTION OF THE DRAWINGS

The drawings referenced herein form a part of the specification. Features shown in the drawings are meant as illustrative of only some embodiments of the invention, and not of all embodiments of the invention unless otherwise explicitly indicated. Implications to the contrary are otherwise not to be made.

DETAILED DESCRIPTION

It will be readily understood that the components of the present invention, as generally described and illustrated in the Figures herein, may be arranged and designed in a wide variety of different configurations. Thus, the following detailed description of the embodiments of the apparatus, system, and method of the present invention, as presented in the Figures, is not intended to limit the scope of the invention, as claimed, but is merely representative of selected embodiments of the invention.

Reference throughout this specification to "a select embodiment," "one embodiment," or "an embodiment" means that a particular feature, structure, or characteristic described in connection with the embodiment is included in at least one embodiment of the present invention. Thus, appearances of the phrases "a select embodiment," "in one embodiment," or "in an embodiment" in various places throughout this specification are not necessarily referring to the same embodiment.

Furthermore, the described features, structures, or characteristics may be combined in any suitable manner in one or more embodiments. In the following description, numerous specific details are provided, such as examples of sensors, detectors, etc., to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

The illustrated embodiments of the invention will be best understood by reference to the drawings, wherein like parts are designated by like numerals throughout. The following description is intended only by way of example, and simply illustrates certain selected embodiments of devices, systems, and processes that are consistent with the invention as claimed herein.

In the following description of the embodiments, reference is made to the accompanying drawings that form a part hereof, and which shows by way of illustration the specific embodiment in which the invention may be practiced. It is to be understood that other embodiments may be utilized because structural changes may be made without departing form the scope of the present invention.

A solar cell is a semiconductor device that converts radiation energy into electrical energy. Reference herein to a diode, solar cell, and active layer are considered synonymous with a solar cell and the definition thereof.

Figure 1:
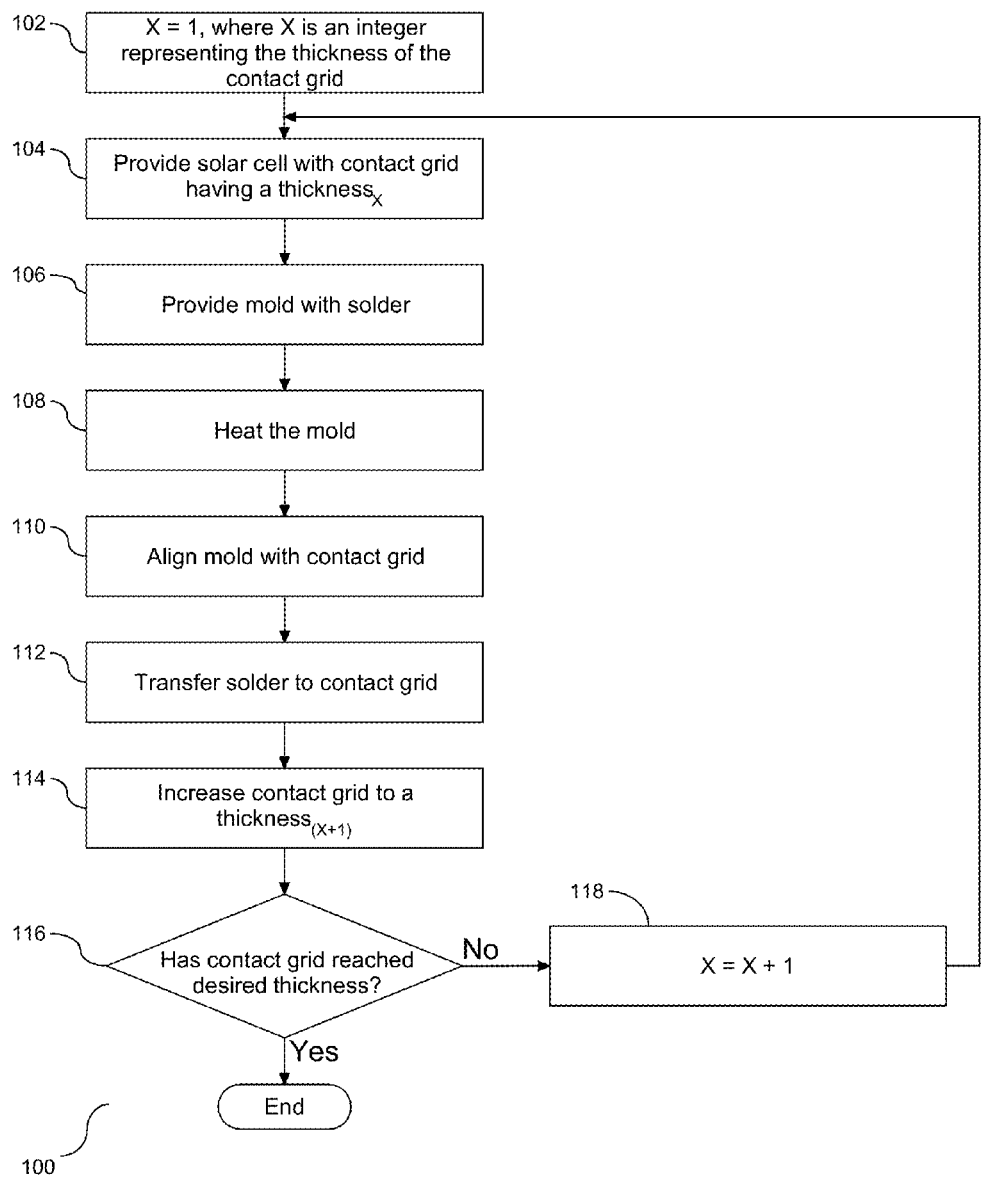
FIG. 1 depicts a flow chart illustrating a process for thickening the contact grid of a solar cell.

FIG. 1 is a flow chart (100) depicting a method for increasing the thickness of a contact grid embedded in a solar cell. A solar cell with an embedded contact grid is provided, the contact grid has a thickness$_x$ (104), where x is an integer. Initially, the variable x is set to the integer one (102). A mold is provided having at least one hollowed out area to receive and contain a solder material (106). In one embodiment, the hollowed out area can be a desired shape, e.g. a semi-sphere. Similarly, in one embodiment, the mold includes an array of hollowed out areas, each of the areas configured to receive solder material.

The mold is heated (108) such that the solder material softens and forms into spherical balls. In one embodiment, the mold is heated such that the solder material protrudes from the hollowed out area of the mold. Following the transformation of the solder material, the mold is aligned with the contact grid such that the solder material is placed in physical contact with the contact grid (110). In one embodiment, the contact grid includes a landing area to direct the alignment of the mold and the contact grid, and the mold is aligned such that the solder material is placed in contact with the landing area of the contact grid. The mold is then re-heated such that the solder material liquefies, e.g. softens, and is transferred from the mold to the contact grid (112). In one embodiment, the hollowed out area of the mold is a desired shape, is left in contact with the solder material until the solder material has solidified with the contact grid, and shapes the solder to take on the desired shape of the hollowed out area.

Upon solidification of the solder, the contact grid increases to a greater thickness$_{x+1}$ (114). It is then determined if the contact grid has reached the desired thickness (116). If the contact grid has reached the desired thickness, the process concludes. If an even greater contact grid thickness is desired, the integer x is incremented (118) followed by a return to step (104). In one embodiment, the integer x may be incremented by a fraction of a whole number. Accordingly, the thickness of the contact grid of a solar cell can be increased to a desired thickness.

Figure 2A:
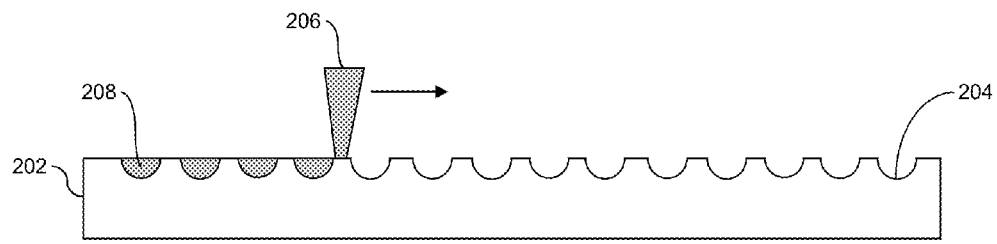
FIGS. 2A, 2B, and 2C are illustrative drawings of a mold containing soldering material.
Figure 2B:
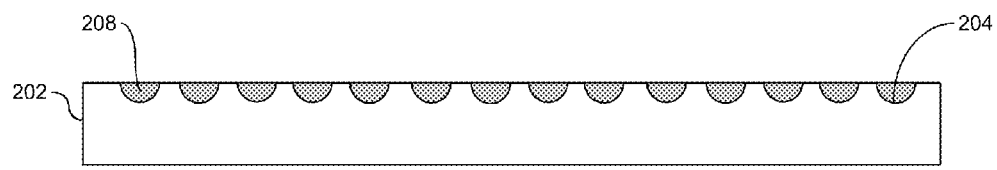
Figure 2C:
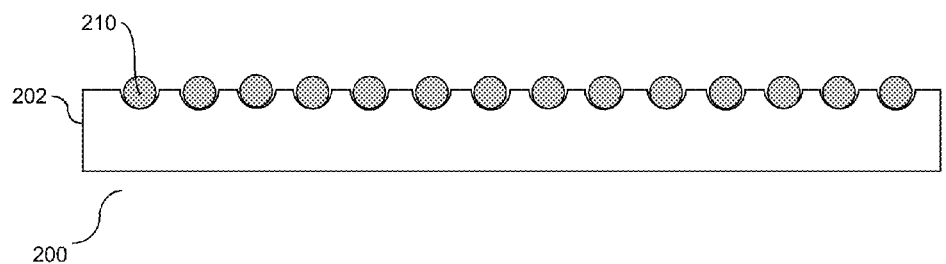

FIGS. 2A, 2B and 2C are illustrative drawings (200) of a mold with solder material. FIG. 2A shows a mold (202) having an array of hollowed out areas (204). In one embodiment the mold is a glass plate. An apparatus (206) fills the hollowed out areas with a solder material (208). In one embodiment, the solder material (208) is lead-free, e.g. solder without lead. FIG. 2B shows the mold (202) with the soldering material (208) contained in the hollowed out areas of the mold (204). FIG. 2C shows the mold (202) heated up such that the soldering material transforms into at least one spherically shaped solder ball (210). Accordingly, solder material is provided with a mold to contain and shape the material.

Figure 3A:
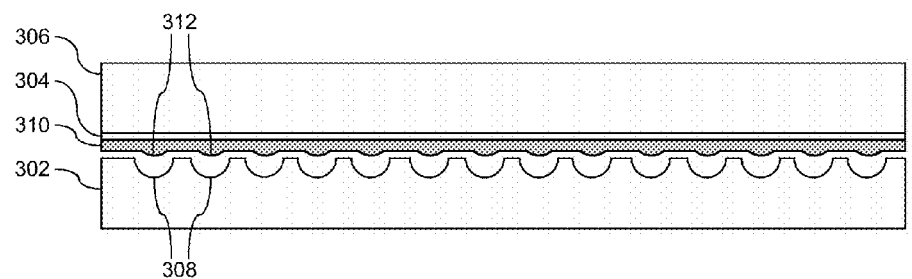
FIGS. 3A and 3B are illustrative drawings depicting the transfer of solder material from a mold to a contact grid.
Figure 3B:
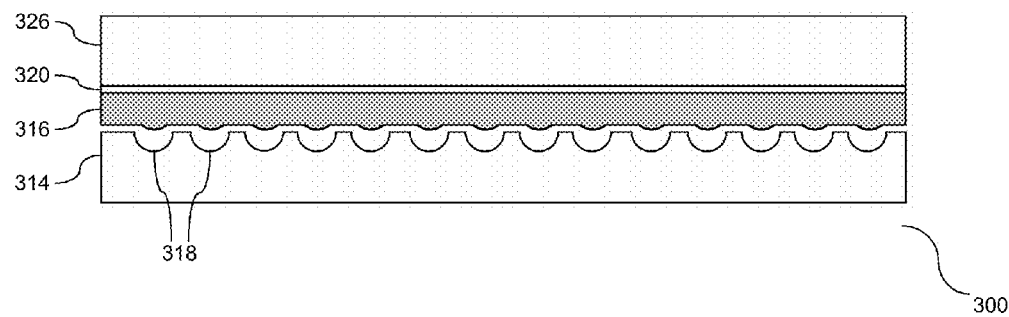

FIGS. 3A and 3B are illustrative drawings (300) depicting the transfer of solder material from a first mold (302) to a contact grid (304) embedded in a solar cell (306). In one embodiment, the contact grid is embedded in the solar cell via screen printing. FIG. 3A shows a first mold (302) having an array of hollowed out areas (308). The first mold when heated up softens the solder and transfers the solder material (310) from the hollowed out areas (308) to the contact grid (304). In one embodiment, the solder (310) is thicker on the contact grid (304) where the hollowed out areas have been aligned (312). In another embodiment, the solder is shaped by the shape of the hollowed out areas and maintains some of that shape upon solidification on the contact grid (304). The formation of the solder material (310) with the contact grid (304) thickens the contact grid (320) reducing series resistance, and increasing efficiency of the solar cell (306).

FIG. 3B is an illustrative drawing of one embodiment of the invention. After having thickened the contact grid with solder material (310), as shown in FIG. 3A, the process can be repeated to increase the thickness of the contact grid (320) embedded in solar cell (326). More specifically, a second mold containing hollowed out areas (314) filled with solder is heated up containing additional solder material (316) in the array of hollowed out areas (318). The second mold (314) is aligned with the thickened contact grid (320). The second mold (314) is re-heated such that the solder material softens and transfers from the hollowed out areas (318) of the second mold (314) to the thickened contact grid (320). This process can be repeated until a contact grid with a desired thickness is achieved. In one embodiment, the second mold (314) is different than the first mold (302). In another embodiment, the second mold (314) may contain an array of hollowed out areas (318) shaped differently than the hollowed out areas (308) of the first mold. Accordingly, a contact grid with a desired thickness and shape is achieved to minimize series resistance.

As shown herein, a solar cell is provided with a contact grid having a defined thickness. The configuration of the mold together with the solder material provides a basis to reduce electrical resistance by increasing the thickness of the contact grid. More specifically, the solder in the hollowed out areas of the mold are heated such that the solder melts to provide a low resistivity contact between the mold and the solar cell. Accordingly, the thickness of the contact grid is increased to a desired thickness through use of the mold and the solder material.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed.

Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Alternative Embodiment

It will be appreciated that, although specific embodiments of the invention have been described herein for purposes of illustration, various modifications may be made without departing from the spirit and scope of the invention. Accordingly, the scope of protection of this invention is limited only by the following claims and their equivalents.

We claim:

1. A method comprising:
for a first body comprising a first mold, the first mold comprising at least two hollowed out areas containing a first solder material and at least two non-hollowed out areas, heating the first body such that the first solder material forms into at least one spherical ball within each hollowed out area;
aligning the first body with a second body, the second body comprising a diode in communication with an inactive layer, the inactive layer including a contact grid with a first thickness, and the first solder material in physical contact with the contact grid, including aligning at least two first respective segments of the contact grid with the at least two hollowed out areas, and aligning at least second and third respective segments of the contact grid with the at least two non-hollowed out areas; and
re-heating the first body including the first solder material softening and transferring from the first body to the second body to form a first solder layer from the solder material on the contact grid, wherein the first solder layer increases the first thickness across an entire length of the inactive layer, wherein the first solder layer comprises a second thickness corresponding to a maximum thickness of the first solder layer occurring at the at least first respective segments, and a third thickness corresponding to a thickness of the first solder layer occurring at the at least second and third respective segments, and wherein the third thickness is less than the second thickness.

2. The method of claim 1, further comprising a second mold different than the first mold, the second mold comprising at least one hollowed out area containing a second solder material, heating the second mold such that the second solder material forms into at least one spherical ball within the hollowed out area;
aligning the second body with the second mold such that the second solder material is in physical contact with the contact grid having the second thickness;
re-forming the second body with the contact grid, including re-heating the second mold including the second solder material softening and transferring from the second mold to the re-formed second body, including increasing the second thickness of the contact grid to a fourth thickness greater than the second thickness.

3. The method of claim 1, wherein the first mold is comprised of glass.

4. The method of claim 1, wherein the solder material is lead free.

5. The method of claim 1, wherein the contact grid includes a landing area, and further comprising placing the solder in contact with the landing area when aligning the first body with the second body.

6. A method comprising:
for a first body comprising a first mold, the first mold comprising at least two hollowed out areas containing a first solder material and at least two non-hollowed out areas, heating the first body such that the first solder material forms into at least one spherical ball within each hollowed out area;
aligning the first body with a second body, the second body comprising a diode in communication with an inactive layer, the inactive layer including a contact grid with a first thickness, and the first solder material in physical contact with the contact grid, including aligning at least two first respective segments of the contact grid with the at least two hollowed out areas, and aligning at least second and third respective segments of the contact grid with at least two non-hollowed out areas;
re-heating the first body including the first solder material softening and transferring from the first body to the second body to form a first solder layer from the solder material on the contact grid, wherein the first solder layer increases the first thickness across an entire length of the inactive layer, wherein the first solder layer comprises a second thickness corresponding to a maximum thickness of the first solder layer occurring at the at least first respective segments, and a third thickness corresponding to a thickness of the first solder layer occurring at the at least second and third respective segments, and wherein the third thickness is less than the second thickness; and
applying a second re-heating of the first body with a second solder material until a desired thickness of the contact grid across the inactive layer is achieved.

7. The method of claim 1, wherein the second thickness is universal across the contact grid.

8. The method of claim 1, wherein the third thickness includes areas of the contact grid between adjacently positioned spherical balls of the first solder material.

9. The method of claim 6, wherein the second thickness is universal across the contact grid.

10. The method of claim 6, wherein the third thickness includes areas of the contact grid between adjacently positioned spherical balls of the first solder material.

11. The method of claim 6, further comprising the first body comprising a second mold, the second mold comprising hollowed out areas shaped differently than the hollowed out areas of the first mold.

* * * * *